United States Patent
Naffziger et al.

(12)

(10) Patent No.: US 6,549,605 B1
(45) Date of Patent: Apr. 15, 2003

(54) LIMITING LOSS IN A CIRCUIT

(75) Inventors: Samuel D. Naffziger, Fort Collins, CO (US); Don Douglas Josephson, Fort Collins, CO (US)

(73) Assignee: Hewlett Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/171,233

(22) Filed: Jun. 14, 2002

(51) Int. Cl.$^7$ ................................................ G11C 19/00

(52) U.S. Cl. ......................... 377/68; 377/73; 377/74; 327/173; 327/176; 327/331

(58) Field of Search ..................... 377/68, 70, 71, 377/73, 74; 327/112, 172, 173, 174, 175, 176, 331, 333

(56) References Cited

U.S. PATENT DOCUMENTS 6,292,041 B1 * 9/2001 Naffziger .................... 327/172

* cited by examiner

*Primary Examiner*—Margaret R. Wambach

(57) ABSTRACT

A circuit for limiting loss in a second circuit. The circuit may include a first timer, a second timer and one or more logic gates. The first timer may produce a first output in a given state if the duration of a pulse for use with the second circuit reaches a first predetermined amount of time, where the first predetermined amount of time is related to a parameter of the second circuit. The second timer may produce a second output in the given state if the first timer does not produce the first output in the given state when the duration of the pulse reaches a second predetermined amount of time. The one or more logic gates may have an output that is the same as the pulse unless and until the output of the first timer or the second timer is in the given state, at which time, the output of the one or more logic gates is forced to a non-pulsed state.

24 Claims, 6 Drawing Sheets

LIMITING LOSS IN A CIRCUIT

FIELD OF THE INVENTION

The invention is generally related to integrated circuits. More particularly, the invention is related to avoidance of loss in integrated circuits.

BACKGROUND

In certain applications, it is desirable to limit the amount of time a signal is active in MOS (complementary metal oxide semiconductor) circuits to protect the circuits against various circuit failure modes. One example of a circuit failure mode is a dynamic decay due to subthreshold leakage. A shift register circuit 10 is shown in FIG. 1 to illustrate the deleterious effects of subthreshold leakage.

The shift register circuit 10 is shown with only three stages for ease of understanding. Each stage comprises a pass gate (or dynamic latch) 15, a dynamic storage node 35, 55 or a static storage node 45, and an inverter 20 formed by a PFET (P-channel field effect transistor) and an NFET (N-channel field effect transistor). A shift signal 27 and its inverse 29, formed by an inverter 28, are connected to each passgate 15. The passgates 15 have alternating PFET/NFET connections to the control lines (signal 27 and its inverse 29). Thus, the first passgate 15 has a PFET hooked to the shift signal 27, the second passgate 15 has an NFET hooked to the shift signal 27, and so on.

The passgates 15 store the logic values at the storage nodes 35, 45, and 55, which are buffered through the inverters 20 to nodes 30, 40 and 50, respectively. When the shift signal 27 transitions from low to high (its inverse 29 transitions from high to low), the first and third passgates 15 "turn off," preventing the new values on nodes 30 and 50 from transferring to storage nodes 35 and 55, respectively. At the same time, the second (and other even) passgate(s) turn on. As a result, the logic value at the node 40 passes to node 45. The first and third passgate 15 being "off" ensures that the correct value is held for storage node 45.

In this design, the logic states stored by the passgates 15 are shifted right each time the inverse shift input signal 29 pulses high.

However, subthreshold leakage occurs through the FETs forming the passgates 15. As used herein, subthreshold leakage is current from source to drain when the gate is off (Vgs=−Vdd for a PFET, Vgs=0 for an NFET).

A PFET conducts from source to drain or "turns on" when its gate voltage is low with respect to its source; whereas an NFET turns on when its gate voltage is high with respect to its source. For example, if the shift signal 27 remains high long enough while node 30 is low and node 35 is high, the subthreshold leakage can result in the loss of the stored charge on node 35 through leakage through the first passgate 15's NFET into ground (through node 30). Protecting the dynamic storage nodes 35 and 55 from failure due to subthreshold leakage requires careful control of the timing of the shift signal 27. However, given the magnitude of variations present in CMOS circuit manufacturing, a one-size-fits-all solution is not practical.

One approach to compensate for subthreshold leakage is to use a leakage limiting circuit connected to the shift register circuit 10. The leakage limiting circuit may track leakage and truncate pulses of the input shift signal 27 when NFET or PFET leakage occur to a predetermined extent, as described in U.S. Pat. No. 6,292,041, incorporated by reference in its entirety herein.

However, for very low leakage process conditions, the time needed to trip the leakage limiting circuit may be very long. The longer circuit tripping time may result in unwanted behavior due to very long slew rates on the output of the circuit.

SUMMARY

A circuit for limiting loss in a second circuit is described. The circuit may include a first timer, a second timer and one or more logic gates. The first timer may produce a first output in a given state if the duration of a pulse for use with the second circuit reaches a first predetermined amount of time, where the first predetermined amount of time is related to a parameter of the second circuit. The second timer may produce a second output in the given state if the first timer does not produce the first output in the given state when the duration of the pulse reaches a second predetermined amount of time. The one or more logic gates may have an output that is the same as the pulse unless and until the output of the first timer or the second timer is in the given state, at which time, the output of the one or more logic gates is forced to a non-pulsed state.

BRIEF DESCRIPTION OF THE DRAWINGS

The invention is illustrated by way of example and not limitation in the accompanying figures in which like numeral references refer to like elements, and wherein.

DETAILED DESCRIPTION

In the following detailed description, numerous specific details are set forth in order to provide a thorough understanding of the invention. However, it will be apparent to one of ordinary skill in the art that these specific details need not be used to practice the invention. In other instances, well known structures, interfaces, and processes have not been shown in detail in order not to obscure unnecessarily the invention.

A circuit and method for limiting loss in integrated circuits is described. The circuit for limiting loss may include a fixed interval timer circuit to limit shift high time when the loss limiting circuit is tracking the leakage from a slow leakage circuit.

Figure 1:
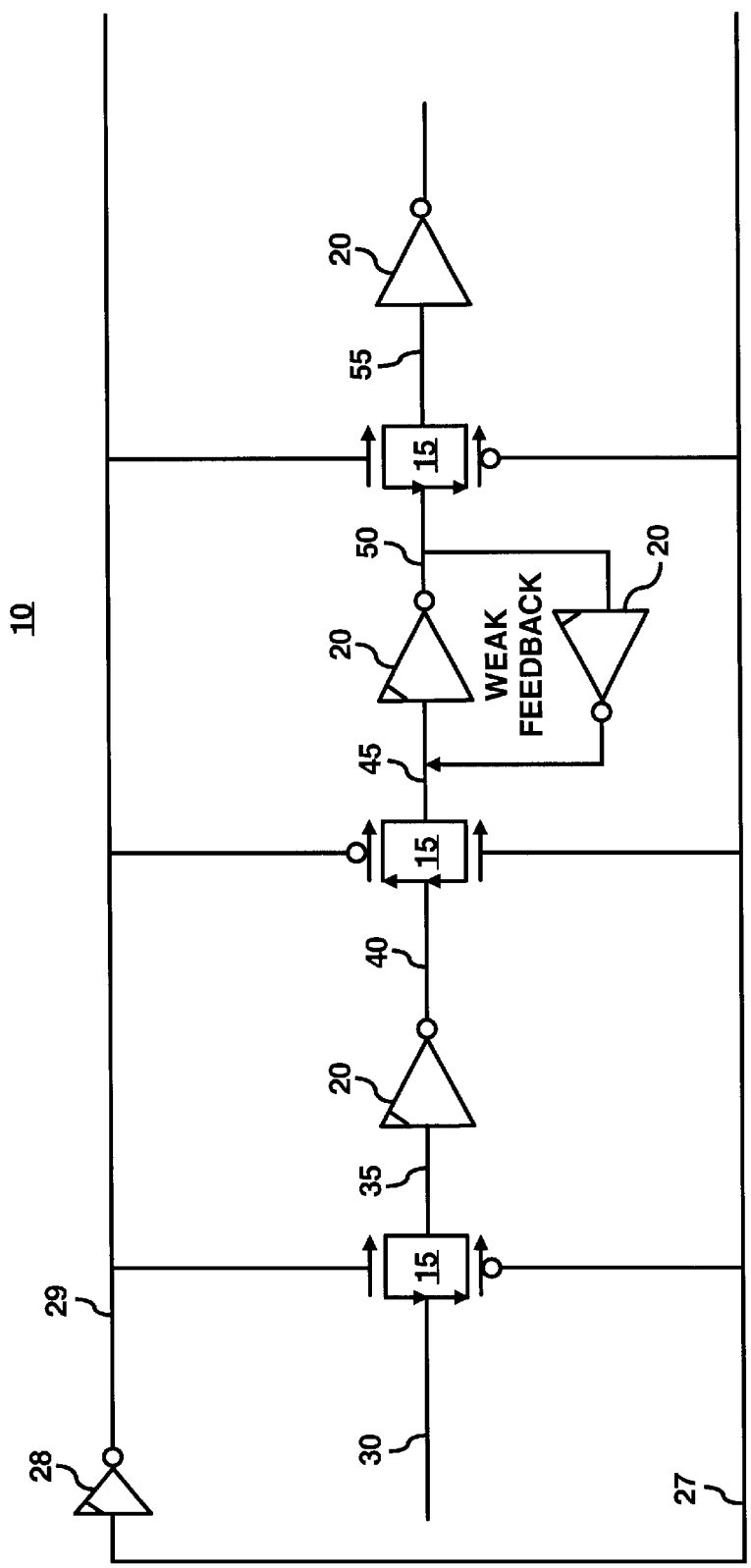
FIG. 1 is a circuit diagram illustrating. one embodiment of a shift register circuit including passgates.
Figure 2:
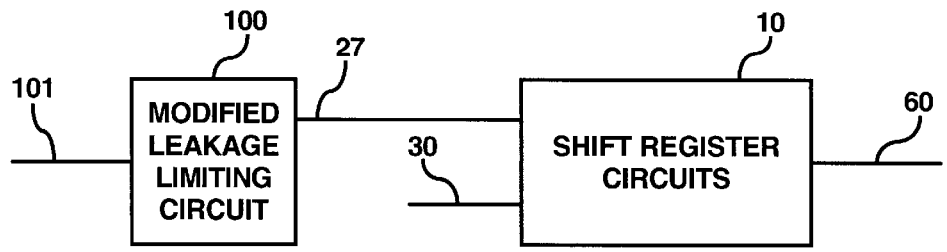
FIG. 2 is a block diagram illustrating the shift register circuit of FIG. 1 along with one embodiment of an apparatus for limiting loss in the shift register circuit.

FIG. 2 illustrates an embodiment of the present invention in the context of surrounding circuits. In particular, FIG. 2 illustrates a modified leakage limiting circuit 100 connected to the shift register circuit 10. An input to the modified leakage limiting circuit 100 is an input shift signal 101. The output of the modified leakage limiting circuit 100 is the shift signal 27, which is an input to the shift register circuit 10. Broadly speaking, the modified leakage limiting circuit 100 processes the input shift signal 101 such that shift pulses propagating through to the shift signal 27 have a duration that is controlled, limited, abbreviated, truncated, shortened or otherwise modified, so as to avoid subthreshold leakage in the shift register circuit 10. By including a fixed interval timer in the modified leakage limiting circuit 100, as shown below with reference to FIGS. 3–5, a provision is also made for slow leakage process conditions. The shift register circuit 10 is exemplary of a broad class of circuits to which the modified leakage limiting circuit 100 may be put to use. For example, any circuit having one or more dynamic storage nodes and/or pass gates would benefit from the modified leakage limiting circuit 100.

Figure 3:
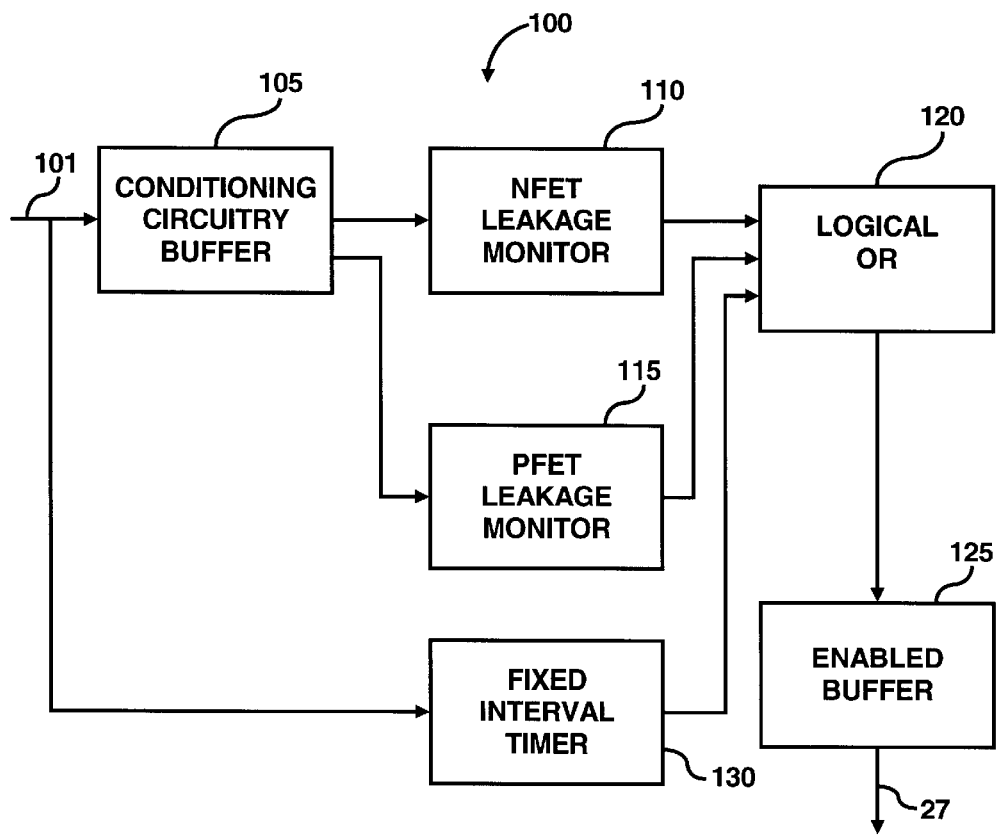
FIG. 3 is a block diagram illustrating one embodiment of the loss limiting apparatus of FIG. 2.

FIG. 3 is an exemplary high level block diagram of the modified leakage limiting circuit 100. The input shift signal 101 is input into the modified leakage limiting circuit 100 through a conditioning circuitry buffer 105 and a fixed interval timer 130. The conditioning circuitry buffer 105 sends the input shift signal 101 to an NFET leakage monitor 110 and to a PFET leakage monitor 115 to simultaneously monitor both NFET leakage and PFET leakage. The outputs of the NFET leakage monitor 110, the PFET leakage monitor 115 and the fixed interval timer 130 are sent to a logical OR gate 120, whose output is sent to an enable buffer 125, which outputs the shift signal 27.

Figure 4:
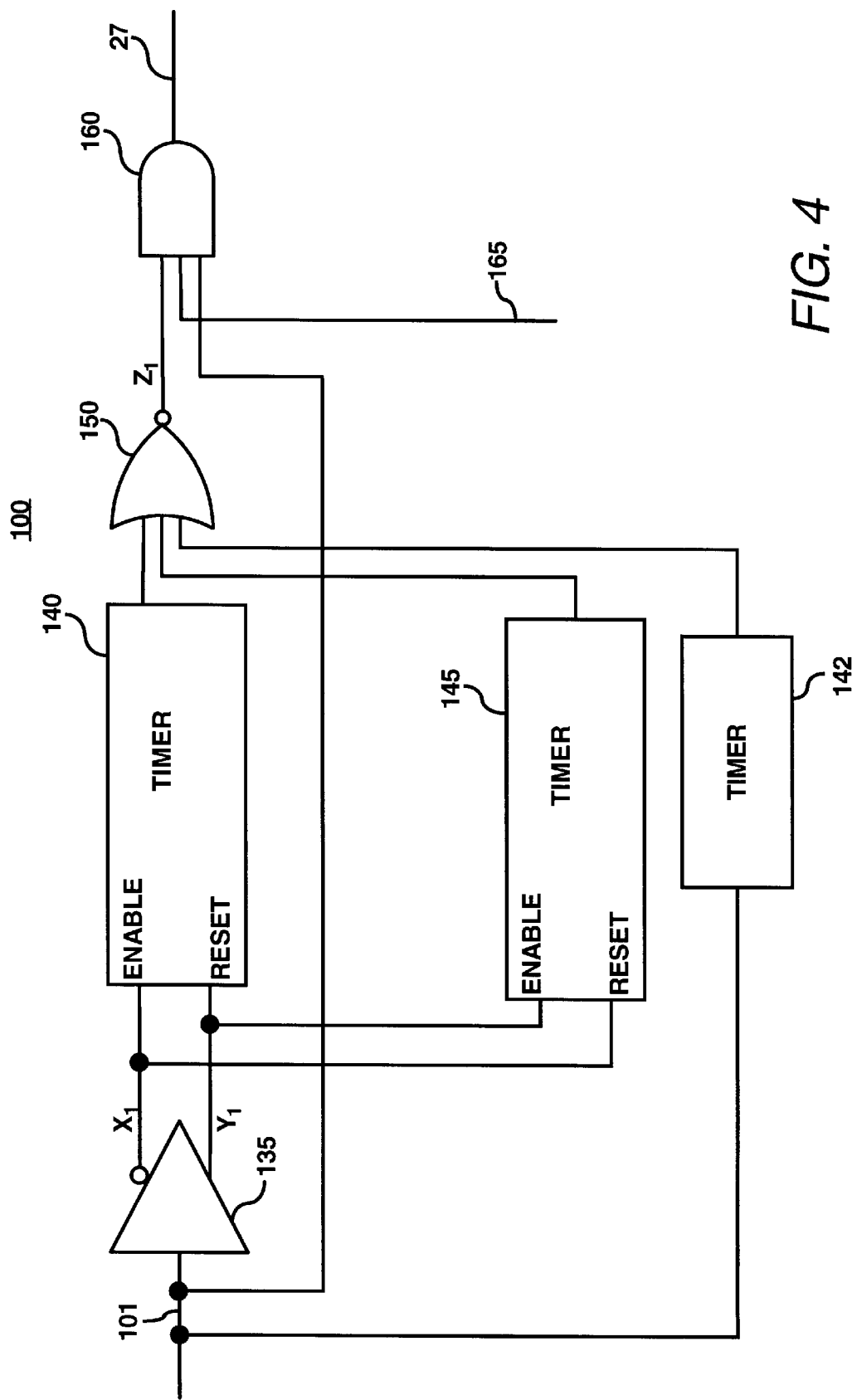
FIG. 4 is a logic diagram illustrating one embodiment of the loss limiting apparatus of FIG. 3.

FIG. 4 is an exemplary logic level diagram of the modified leakage limiting circuit 100. FIG. 4 illustrates the modified leakage limiting circuit 100 from a functional point of view. The input shift signal 101 is input into a buffer 135, which is coupled to first timer 140 and second timer 145. The input shift signal 101 is also input into a third timer 142. The outputs of the buffer 135 are signals X1 and Y1. The signal X1 is the inverse of the input shift signal 101, and the signal Y1 is the same as the input shift signal 101. The signal X1 enables the first timer 140. That is, the first timer 140 starts counting time ("ticking") when the signal X1 transitions from low to high. The first timer 140 continues to tick for a predetermined amount of time, unless the signal Y1 goes high, causing the first timer 140 to reset. The predetermined amount of time is dependent on a value of a particular process parameter being monitored (not shown). Thus, unless the signal Y1 resets the first timer 140, the first timer 140 delays the rising edge of the signal X1 by the predetermined amount of time.

The second timer 145 performs similarly to the first timer. However, the Y1 signal is input as the enable signal and the X1 signal is the reset signal. The output signals from the timers 140, 142 and 145 are input to a NOR gate 150. An output signal $Z_1$ from the NOR gate 150 is input to an AND gate 160. In addition, the shift input signal 101 and an enable signal 165 are input to the AND gate 160, whose output is the shift signal 27. The shift signal 27 is used by other circuits, such as a pass gate, near the modified leakage limiting circuit 100. The other circuits are sensitive to one or more of the process parameters being monitored by the modified leakage limiting circuit 100.

Figure 5A:
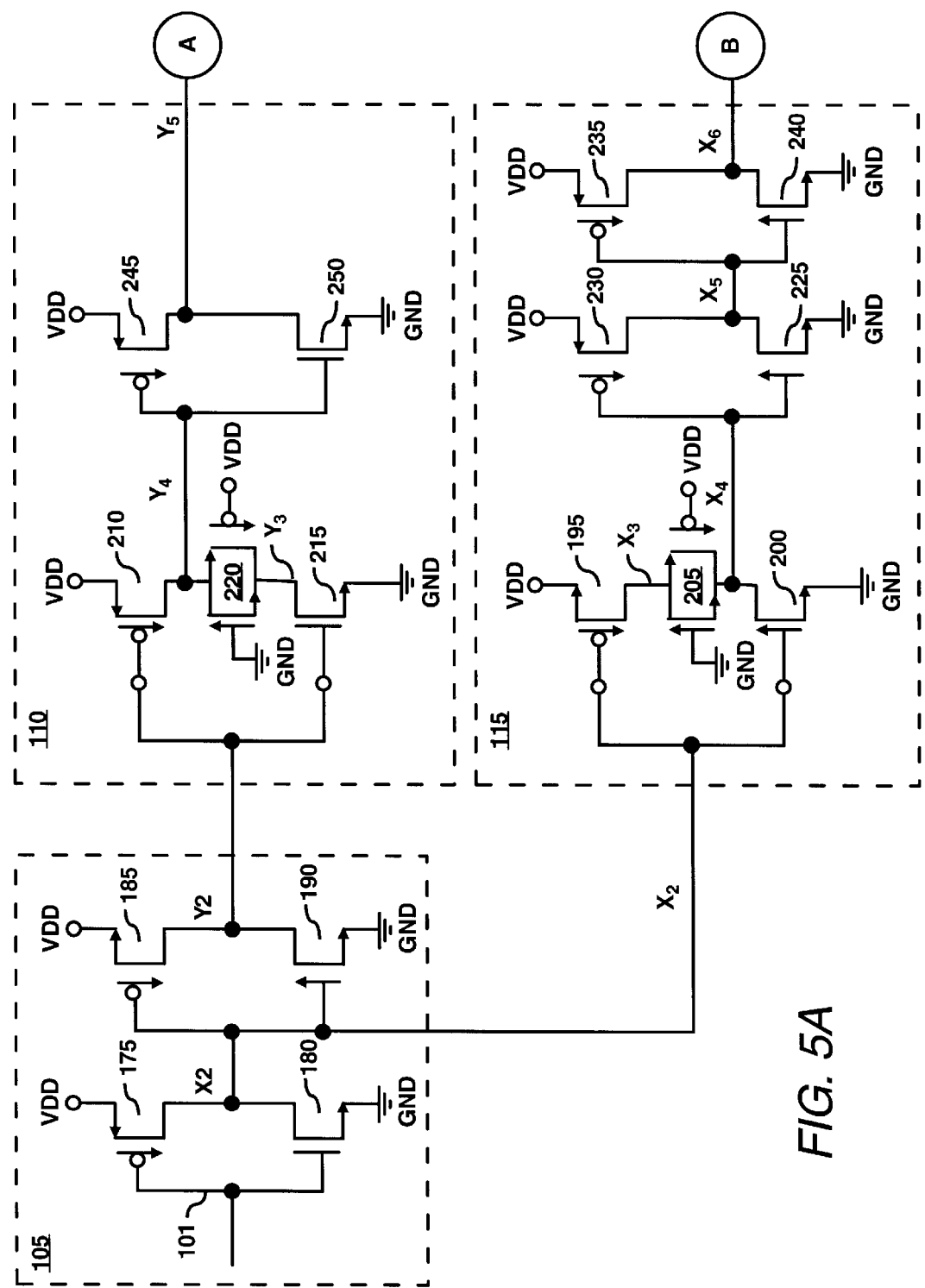
FIGS. 5A, 5B and 6 are schematic diagrams illustrating exemplary embodiments of the loss limiting apparatus of FIG. 3.
Figure 5B:
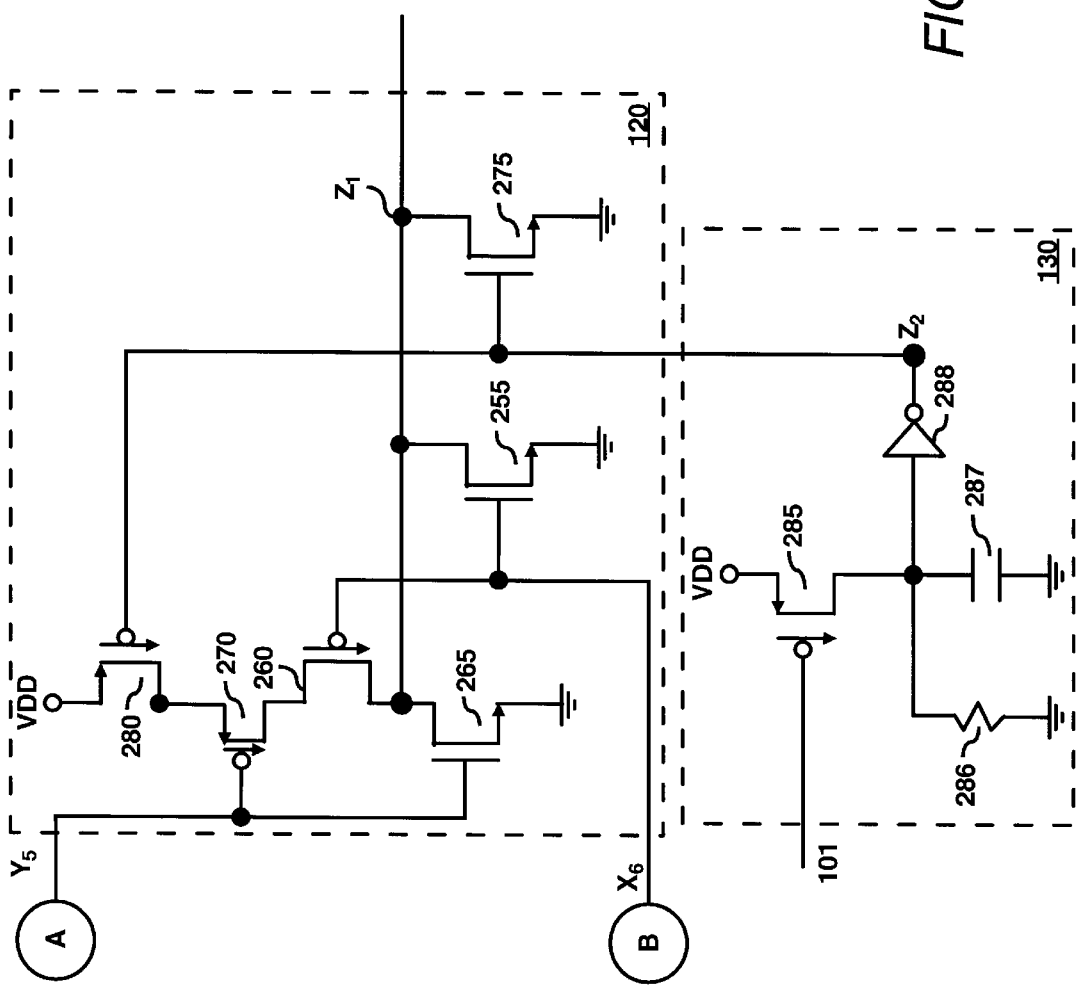
Figure 6:
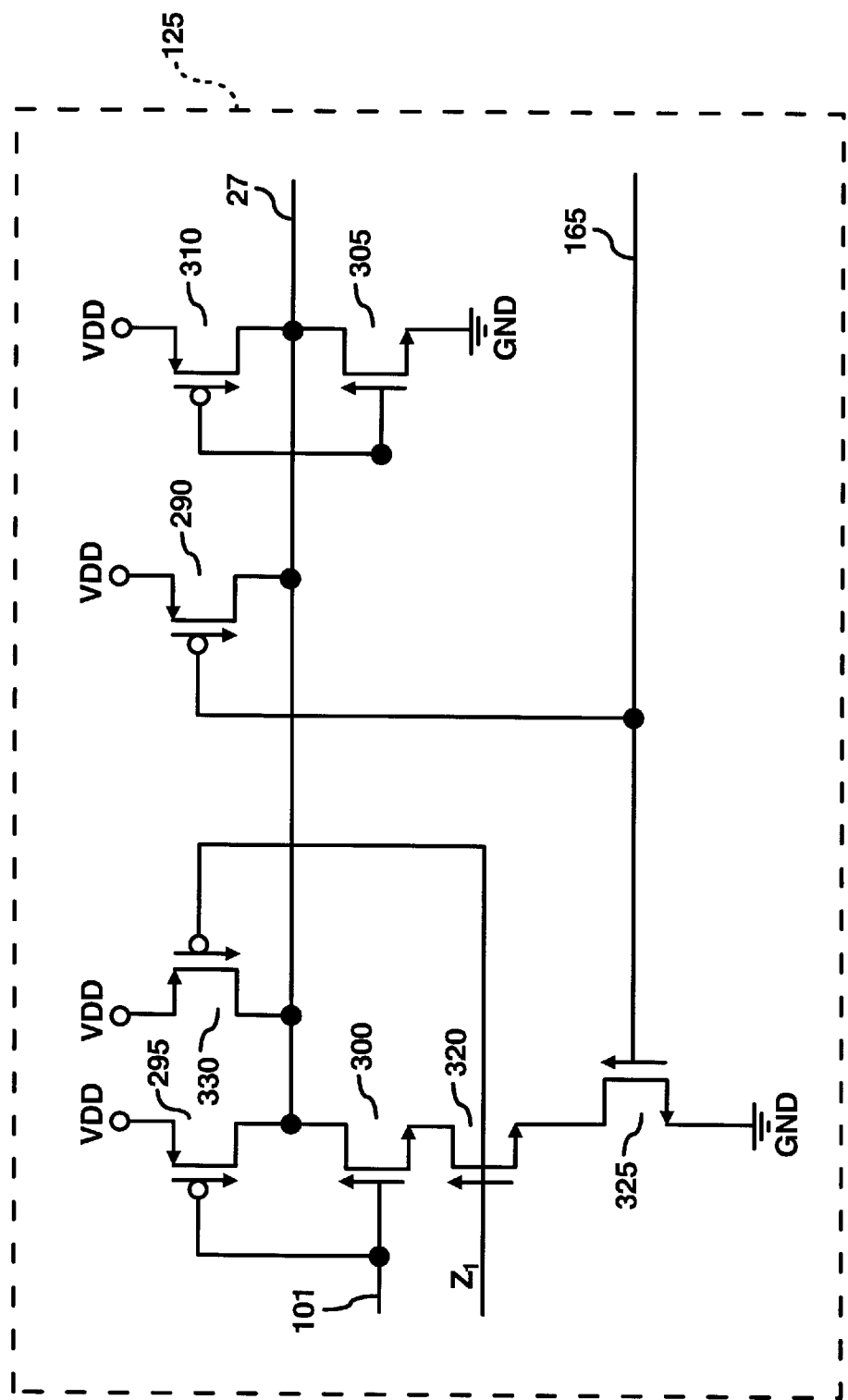

Many different logic circuits may be designed to perform as the logic shown in FIG. 4. For example, gate transformations may result in different but logically equivalent circuits. FIGS. 5A, 5B and 6 are exemplary schematic diagrams of the modified leakage limiting circuit 100 at a transistor level for use in tracking FET leakage. The input shift signal 101 is connected to the gate terminals of a PFET 175 and an NFET 180, connected in an inverter configuration having an output signal X2 (see FIG. 5A), as well as to the gate terminal of a PFET 285 that is part of a shift limiting circuit (see FIG. 5B).

When the input shift signal 101 is high, the PFET 175 is an open circuit between its source and drain terminals (i.e., "turned off"), while the NFET 180 conducts from its source to drain (i.e., "turns on"). Thus, when the input shift signal 101 is high, the signal X2 is low by virtue of its connection to ground via the NFET 180. Likewise, when the input shift signal 101 is low, the signal X2 is high as the PFET 175 is turned on and the NFET 180 is turned off. The signal X2 is input to a PFET 185 and an NFET 190, both of which are together configured as an inverter having an output signal Y2. Thus, the signal Y2 is the logical inverse of the signal X2, and thus the same as the input shift signal 101 (except for switching delays).

The signal Y2 serves as the input signal for the NFET leakage monitor 110. In particular, the signal Y2 is input to the gate terminals of a PFET 210 and an NFET 215. The PFET 210 and the NFET 215 are configured like an inverter except for an NFET-PFET pair 220 (often called a "pass gate") connected between the PFET 210 and the NFET 215. When the signal Y2 is high, the NFET 215 is turned on and a node Y3 is pulled low. The low voltage at the node Y3 and the high voltage at a node Y4 place the pass gate 220 in a condition where subthreshold leakage occurs from the node Y4 to the node Y3.

The transistors of the pass gate 220 have substantially greater width than those of the typical pass gates in the protected circuit. Because the amount of subthreshold leakage is proportional to the width of the transistor, the pass gate 220 will exhibit subthreshold leakage at an accelerated rate. Over time, the subthreshold leakage drains charge from the node Y4 into the node Y3 until the node Y4 is forced low like the node Y3.

The logic level at the node Y4 is inverted by the arrangement of a PFET 245 and an NFET 250, producing an output signal Y5. Thus, the output signal Y5 transitions from low to high some time after the signal Y2 transitions from low to high. The amount of time necessary for this to happen is based on the width of the transistors of the pass gate 220 and the subthreshold leakage value. When the input shift signal 101, and thus the signal Y2, transitions from high to low, the PFET 210 turns on, forcing the signal Y4 high and thus the signal Y5 low, regardless of any subthreshold leakage. Overall, the signal Y5 is low except when the shift input signal 101 pulses high for too long a time, after which the signal Y5 pulses high until the shift input signal 101 pulse ends.

The PFET leakage monitor 115 is similar to the NFET leakage monitor 110. The input to the PFET leakage monitor 115 is the complement of the input to the NFET leakage monitor 110. Accordingly, the PFET leakage monitor 115 includes an additional inverter on its output. The signal X2 is the input signal for the PFET leakage monitor 115. In particular, the signal X2 is input to the gate terminals of a PFET 195 and an NFET 200. The PFET 195 and the NFET 200 are configured like an inverter except for an NFET-PFET pair (or pass gate) 205 connected between the PFET 195 and the NFET 200. When the signal X2 is low, the PFET 195 is turned on and a node X3 is pulled high. The high voltage at the node X3 places the pass gate 205 in a condition where subthreshold leakage occurs from the node X3 to a node X4.

The transistors of the pass gate 205 have substantially greater width than a typical FET. Because the amount of subthreshold leakage is proportional to the width of the transistor, the pass gate 205 exhibits subthreshold leakage at an accelerated rate. Over time, the subthreshold leakage trickles charge onto the node X4 until the node X4 is forced high like the node X3. The logic level at the node X4 is inverted first by the arrangement of a PFET 230 and an NFET 225, and again by the arrangement of a PFET 235 and an NFET 240, producing an output signal X6. Thus, X6 transitions from low to high some time after the signal X2 transitions from high to low. The amount of time necessary for this to happen is based on the width of the transistors of the pass gate 205 and the subthreshold leakage of the transistors.

When the input shift signal 101 transitions from high to low and the signal X2 transitions from low to high, the NFET 200 turns on, forcing the signals X4 and X6 low, regardless of any subthreshold leakage. Overall, the signal X6 is low except when the shift input signal 101 pulses high for too long a time, after which the signal X6 pulses high until the shift input signal 101 pulse ends.

The pass gates 205 and 220 are similar, but they monitor leakage in different ways. In particular, the pass gate 220 monitors a stored high. voltage (at the node Y4) leaking to a low voltage, whereas the pass gate 205 monitors a stored low voltage (at the node X4) leaking to a high voltage. Because leakage across an NFET is the primary mechanism for leaking charge from a high voltage to a low voltage, the pass gate 220 is part of the NFET leakage monitor 10. Likewise, because leakage across a PFET is the primary mechanism for leaking charge from a low voltage to a high voltage, the pass gate 205 is part of the PFET leakage monitor 115.

The input shift signal 101 is the input signal for the fixed interval timer 130. The input shift signal 101 is input to the gate terminal of a PFET 285. The drain of the PFET 285 is coupled to a an inverter 288, a capacitor 287 and a resistor 286. When the input shift signal 101 transitions from high to low, PFET 285 turns on, charging capacitor C1. The signal at the drain of the PFET 285 is output through inverter 288 at node Z2. Thus, Z2 is low when the input shift signal 101 is low. The signal Z2, output from the fixed interval timer 130 is input to the gate of a PFET 280. Thus, when the capacitor 287 is charged up, causing Z2 to go low, the PFET 280 is on.

When the shift signal 101 transitions from low to high, the PFET 285 turns off. Capacitor 287 discharges at a predetermined rate, causing the output Z2 to go high after some fixed time interval. Thus, when the capacitor 287 discharges, Z2 goes high and shuts off PFET 280.

The signals Y5 and X6, output from the NFET leakage monitor 110 and the PFET leakage monitor 115, respectively, are input to an arrangement of NFETs 255 and 265 as well as PFETs 260 and 270, which form a NOR gate 120 and produce the signal Z1 as its output. In this way, Z1 is low if any of the signal Y5, the signal X6 or the signal Z2 is high. The signal Z1, of FIG. 5B, is input to an NFET 320 and a PFET 330, which are part of an enabled buffer 125, as shown in FIG. 6. Also input to the enabled buffer 125 are the input shift input signal 101, which is connected to an NFET 300 and a PFET 295, and the enable signal 165, which is connected to an NFET 325 and a PFET 290. An NFET 305 and a PFET 310 complete the enabled buffer 125, whose output is the shift signal 27. The shift signal 27 is high if all of the signal Z1, the shift input signal 101 and the enable single 165 are high. That is, when enabled, pulses on the shift signal 27 are possibly truncated versions of pulses on the input shift signal 101. Truncation results when either NFET leakage or PFET leakage, whichever is first, occurs to the necessary extent, or if the fixed interval timer 130 is tripped (where the NFET or PFET leakage are too slow).

In summary, the modified leakage limiting circuit 100 protects circuits that use the shift signal 27 from failure. In particular, the modified leakage limiting circuit 100 protects from failures produced by subthreshold leakage and any other mechanism that causes loss of state over time on dynamic storage nodes. For example, the protected circuit is one, like the shift register circuit 10, containing a dynamic latch. For best protection, the protected circuit and the modified leakage limiting circuit 100 should be located physically near to one another and constructed using the same or similar manufacturing processes, so that the correlation between the protected circuit and the modified leakage limiting circuit 100 is high. For example, the FETs forming the pass gates 220 and 205 are ideally very similar to the FETs forming the pass gates 15, except for their widths. Preferably, the modified leakage limiting circuit 100 and the protected circuit are on the same integrated circuit so that manufacturing process variations are minimized.

The terms and descriptions used herein are set forth by way of illustration only and are not meant as limitations. For example, one skilled in the art will readily recognize that the FETs illustrated in FIGS. 5 and 6 are exemplary of switching devices generally and that other switching devices may be utilized in their places to accomplish the same or similar functions. Those skilled in the art will recognize that these and many other variations are possible within the spirit and scope of the invention as defined in the following claims, and their equivalents, in which all terms are to be understood in their broadest sense unless otherwise indicated.

What is claimed is:

1. A circuit for limiting loss in a second circuit, the circuit comprising:
    a first timer producing a first output in a given state if the duration of a pulse for use with the second circuit reaches a first predetermined amount of time, wherein the first predetermined amount of time is related to a parameter of the second circuit;
    a second timer producing a second output in the given state if the first timer does not produce the first output in the given state when the duration of the pulse reaches a second predetermined amount of time; and
    one or more logic gates having an output that is the same as the pulse unless and until the output of the first timer or the second timer is in the given state, at which time, the output of the one or more logic gates is forced to a non-pulsed state.

2. The circuit of claim 1, wherein the parameter is a leakage rate.

3. The circuit of claim 2, wherein the second predetermined amount of time is longer than a preset time wherein the preset time is the amount of time the first timer would take to produce the first output in the given state if the leakage rate was a leakage rate for high leakage process conditions.

4. The circuit of claim 2, wherein the leakage rate is a subthreshold leakage rate across a switching device.

5. The circuit of claim 4, wherein the switching device is a FET.

6. The circuit of claim 1, wherein the second predetermined amount of time is related to a leakage rate for high leakage process conditions.

7. The circuit of claim 1, further comprising:
    a third timer, wherein the third timer produces a third output in the given state if the duration of the pulse reaches a third predetermined amount of time, wherein the third predetermined amount of time is related to a second parameter of the second circuit.

8. The circuit of claim 7, wherein the one or more logic gates comprise:

a NOR gate having inputs accepting the first output of the first timer, the second output of the second timer and the third output of the third timer.

9. The circuit of claim 7, wherein the one or more logic gates comprise:

an AND gate having an input connected to the output of the NOR gate and an input accepting the pulse.

10. The circuit of claim 9, wherein the AND gate further comprises an input connected to an enable signal.

11. The circuit of claim 1, wherein the second timer comprises:

a capacitor having a positive node coupled to a drain of a PFET and a negative node coupled to ground, wherein the gate terminal of the PFET is coupled to receive the pulse.

12. The circuit of claim 11, wherein the second timer further comprises an inverter coupled to the positive node of the capacitor and a resistor coupled to the positive node of the capacitor, the output of the inverter comprising the second output.

13. The circuit of claim 1 wherein the second circuit comprises a dynamic latch.

14. The circuit of claim 1 wherein the circuit and the second circuit are packaged together in an integrated circuit.

15. A method for use with a circuit in which leakage can occur at a first rate, the method comprising:

sensing a condition that prompts leakage to occur in the circuit:

producing, in response to the sensing step, a related leakage at a second rate, the second rate being faster rate than the first rate;

producing a limiting signal at a third rate, the third rate being a predetermined rate slower than the second rate; and disabling the condition if the related leakage reaches a first predetermined level or the limiting signal reaches a second predetermined level.

16. The method of claim 15 wherein the leakage is a subthreshold leakage across a FET.

17. The method of claim 15 wherein the condition is a pulse.

18. The method of claim 17 wherein sensing the condition comprises buffering the pulse.

19. The method of claim 15 wherein disabling the condition comprises terminating the pulse.

20. A means for use with a circuit in which leakage can occur at a first rate, the means comprising:

means for sensing a condition that prompts leakage to occur in the circuit;

means for producing, in response to the sensing step, a related leakage at a second rate, the second rate being faster rate than the first rate;

means for producing a limiting signal at a third rate, the third rate being a predetermined rate slower than the second rate; and means for disabling the condition if the related leakage reaches a first predetermined level or the limiting signal reaches a second predetermined level.

21. The means of claim 20 wherein the leakage is a subthreshold leakage across a FET.

22. The means of claim 20 wherein the condition is a pulse.

23. The means of claim 22 wherein the means for sensing comprises means for buffering the pulse.

24. The means of claim 20 wherein the means for disabling comprises means for terminating the pulse.

* * * * *